United States Patent
Whitefield et al.

(10) Patent No.: US 7,277,813 B2
(45) Date of Patent: Oct. 2, 2007

(54) PATTERN DETECTION FOR INTEGRATED CIRCUIT SUBSTRATES

(75) Inventors: Bruce J. Whitefield, Camas, WA (US); Paul J. Rudolph, West Linn, OR (US); James N. McNames, Portland, OR (US); Byungsool Moon, Beaverton, OR (US)

(73) Assignees: State of Oregon University Portland State, Portland, OR (US); LSI Corporation, Milpitas, CA (US)

( * ) Notice: Subject to any disclaimer, the term of this patent is extended or adjusted under 35 U.S.C. 154(b) by 22 days.

(21) Appl. No.: 11/116,591

(22) Filed: Apr. 28, 2005

(65) Prior Publication Data

US 2006/0190207 A1    Aug. 24, 2006

Related U.S. Application Data

(60) Provisional application No. 60/656,700, filed on Feb. 24, 2005.

(51) Int. Cl.
G01R 27/28  (2006.01)

(52) U.S. Cl. .................................................. 702/117

(58) Field of Classification Search ................. 702/117
See application file for complete search history.

(56) References Cited

U.S. PATENT DOCUMENTS

2006/0064268 A1*  3/2006  Dorough et al. ............ 702/117

* cited by examiner

Primary Examiner—Carol S. W. Tsai
Assistant Examiner—Xiuqin Sun
(74) Attorney, Agent, or Firm—Luedeka Neely & Graham, P.C.

(57) ABSTRACT

A method for selecting test site locations on a substrate, by a) specifying a subset of all test site locations on the substrate, and b) selecting a desired number of candidate test site locations from within the subset of test site locations on the substrate. c) While selecting one of the candidate test site locations and holding all others of the candidate test site locations as fixed, determining a new location for the selected one of the candidate test site locations, which new location increases a test sensitivity, as estimated by a trace of a variance-covariance matrix. d) Repeating step (c) for each candidate test site location in the subset of test site locations, to produce a finalized set of candidate test site locations, until a desired end point is attained.

20 Claims, 1 Drawing Sheet

PATTERN DETECTION FOR INTEGRATED CIRCUIT SUBSTRATES

This application claims a priority date based on provisional application 60/656,700, filed Feb. 24, 2005.

FIELD

This invention relates to the field of integrated circuit fabrication. More particularly, this invention relates to determining measurement locations on a substrate on which integrated circuits are formed.

BACKGROUND

Measurements are made on substrates during semiconductor manufacturing in order to control the process. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Typically, a pattern of measurements across the substrate is selected that is expected to adequately represent the entire substrate with the minimum number of measurements. Since these measurements are generally made on test structures that are placed in the die scribe lines (the space between active dice) the pattern of the measurement is constrained by the way that the dice are placed on the substrate, and where in the scribe line the measurement structure is located. A minimum number of measurements are desired due to the high cost of measurements. The cost is driven by cycle time, equipment costs, throughput and other factors.

The pattern of measurements across the substrate is assumed to measure the non uniformity of a critical parameter such as film thickness, line width, and other critical dimensions. The hidden assumption is that the pattern across the substrate is relatively smoothly varying, or is detectable according to some other anticipated characteristic.

In practice, a desirable aspect of the substrate measurements is to detect the presence of a characteristic spatial pattern across the substrate that represents a shift in the process. Substrate processes can fail to be uniform in a number of different patterns that are often characteristic of the process or equipment being used. For example, a chemical mechanical planarization process may often deviate from uniformity in a doughnut or ring type of pattern. A photolithography process may deviate from uniformity in a checkerboard pattern, due to factors such as mask misalignment or ill-conditioned light exposure. Oxidation or other high-temperature processes can produce linear thickness gradients across the substrate or spots of thickness variation near boat contacts.

Once a process is established in manufacturing, the objective of taking measurements is often no longer to establish the uniformity of the process, but rather to detect variations from the normal uniformity. The nonuniformity is usually a limitation of the process equipment. The integration of a nonuniform process with a down stream nonuniform process can be beneficial for product yield because the nonuniformities can be controlled to compensate for each other. Early detection of certain patterns that indicate a process drift is valuable. Often the pattern will indicate the specific source of the drift.

Variations in integrated circuit processing on substrates frequently follow patterns across the substrate. Excessive variation can lead to device failure, lower yields, and reduced value of the substrate. In order to monitor and control processes variations, the typical practice in the industry is to reduce the measurement results to summary statistics, such as average and range (maximum value-minimum value). There values are in turn plotted on a statistical process control chart for monitoring and controlling process variation. Countermeasures are taken when these values vary outside of the normal distribution of data.

The problem with this approach is that when processes start to drift out of control, this method might not detect any characteristic pattern that might be dictated by the physical configuration of the process equipment. The measurement sample plan may or may not be sensitive to the changing pattern. In addition, the reduction of the measurement values to simple means and ranges can further reduce the ability to identify a failure or detect subtle patterns.

Statistical process control approaches have also been used to detect process variation, but are not sensitive to the emergence of a specific pattern that is known to signify pending process failure. If the statistical process control limits are set tighter, they may signal the failure, but at the expense of detecting other variations that are normal and do not signal a failure (a false positive).

In current practice, the selection of measurement patterns is heavily weighted towards minimizing the costs of taking the measurement. However, additional consideration should be given to the measurement strategy, if the selected sample plan can actually detect patterns of interest.

Different methods have been developed to compensate for this failure. For example, there is a variety of existing sample plans that are available from metrology tool manufacturers that attempt to capture patterns. However, these are fixed patterns that do not take in to account the die size or location. They are not optimized for specific patterns that are on the substrates.

Another method is user definable custom measurement patterns. Engineers can eyeball the pattern on a substrate with a larger number of measurements and estimate a plan for a reduced number of measurements that appears to represent the typical process pattern. While an informed engineering decision determining sample pattern can be effective, this is not a systematic approach and provides no figures of merit for different sample plans to make a decision with. No algorithms exist for selecting measurement locations.

Finally, increasing the number of measurements across the substrate in an effort to increase the probability of detecting spatial patterns of interest has also been attempted. However, increasing the number of measurements reduces the throughput of the equipment, and may mean that more equipment must be purchased and slows down process cycle times. This adds to the substrate cost.

What is needed, therefore, is a system of inspection site location determination and measurement analysis that overcomes problems such as those described above, at least in part.

SUMMARY

The above and other needs are met by a method for selecting test site locations on a substrate, by a) specifying a subset of all test site locations on the substrate, and b) selecting a desired number of candidate test site locations from within the subset of test site locations on the substrate.

c) While selecting one of the candidate test site locations and holding all others of the candidate test site locations as fixed, determining a new location for the selected one of the candidate test site locations, which new location increases a test sensitivity to at least one predetermined pattern, as estimated by a trace of a variance-covariance matrix. d) Repeating step (c) for each candidate test site location in the subset of test site locations, to produce a finalized set of candidate test site locations, until a desired end point is attained.

Thus, the present invention provides several advantages over the prior art, including the ability to quantify the effectiveness to measure specific patterns through a goodness of fit or other such indicator. In addition, efficiencies are gained by using the optimization routine, limiting confusion as to the most efficient method to capture patterns. The pattern library provides a means to capture and store historical patterns for convenient use with new technologies. The real-time calculation of the strength of the pattern provides another dimension of measurement. Statistical process control trending of this information provides early warning of emerging characteristic patterns.

The pattern library provides a means to capture and store historical patterns for convenient use with new technologies. The real-time calculation of the strength of the pattern provides another dimension of measurement. Statistical process control trending of this information provides early warning of emerging characteristic patterns.

In various embodiments, the desired end point is that the test sensitivity cannot be further increased by selecting a new location within the finalized subset of test site locations on the substrate. Alternately, the desired end point is that all locations within the finalized subset of test site locations on the substrate have been adjusted for a desired number of iterations. Further yet, the desired end point may be that the test sensitivity has attained a desired level. In some embodiments, characteristics of the substrate are sensed at the finalized subset of test site locations, and the sensed characteristics are analyzed to determine whether the sensed characteristics indicate at least one of the presence of the predetermined pattern on the substrate, or that the predetermined pattern on the substrate has changed by at least a given amount. The characteristics of the substrate may be sensed by optical inspection of the substrate, electrical test of the substrate, or any measurement technique that provides a quantitative value associated with a spatial coordinate on the substrate.

BRIEF DESCRIPTION OF THE DRAWING

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
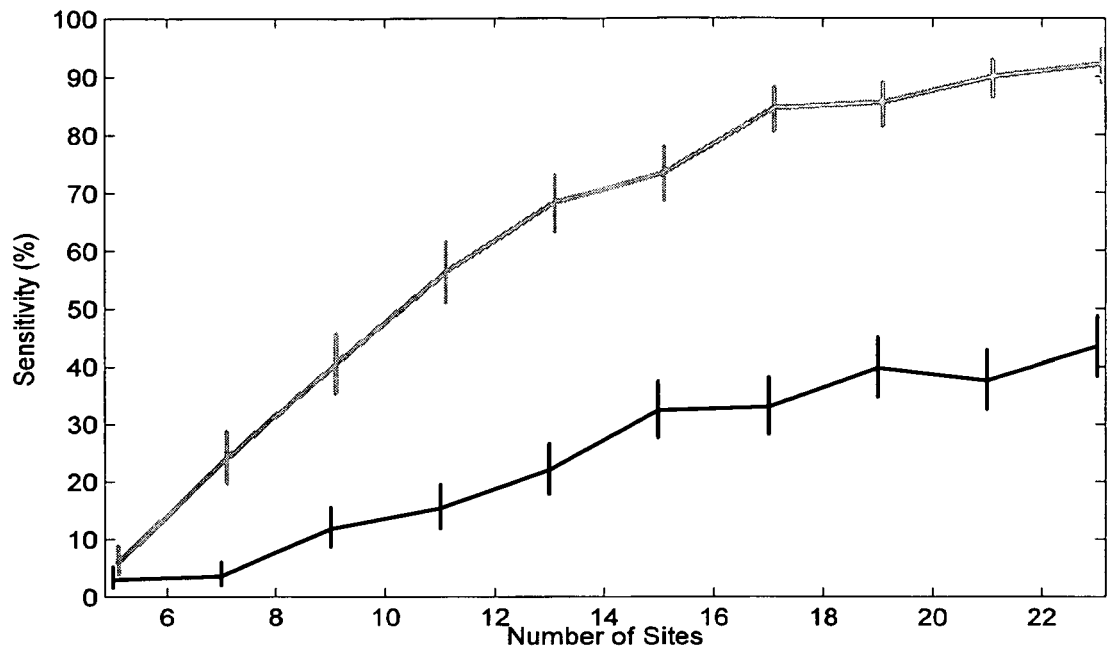
FIG. 1 depicts the sensitivity of three different sampling methods for a range of sampling sites.

The preferred embodiments of the present invention consist of three components. The first component is a hypothesis test that determines whether specific spatial patterns exist on a substrate given a sparse set of samples. The second component is a hypothesis test that determines whether a spatial pattern is different than an expected, specified pattern. The third component is an algorithm for selecting a set of sample sites that approximately maximizes the sensitivity to specified patterns. The performance of all three of these components can be verified with Monte Carlo simulations. This method makes use of the methods and structures described in U.S. patent application Ser. No. 10/927,802, filed Aug. 27, 2004, entitled Pattern Component Analysis, which disclosure is included by reference herein in its entirety.

Linear Regression to Estimate Components of Substrate Spatial Variation

Regression models enable process engineers to identify systematic variation and to quantify unspecified variation into some specific components of interest. Linear regression is preferably used to find the best linear combination of basis functions that explains the systematic spatial variation across the substrate. The basis functions that have been developed include indicator variables for each reticle position, sinusoidal functions of the distance from the center of the substrate, polynomial functions of the Cartesian coordinates of each die, and sinusoidal functions of the die angle. Examples of several of these components are depicted in the patent application referenced above.

A mathematical assumption is made that the measurements on the substrate are generated by a statistical model, preferably of the form:

$$z = \sum_{i=1}^{n_c} \alpha_i b_i(x, y, r) + \varepsilon$$

where z is a measurement corresponding to a site on the substrate with Cartesian coordinates x,y and reticle position r, $b(x,y,r)$ is the $i^{th}$ basis function, $\varepsilon$ is a random variable that represents random variation in the measurements, and $\alpha_i$ is the unknown coefficient of the $i^{th}$ basis function.

The regression model is preferably of a similar form:

$$\hat{z} = \sum_{i=1}^{n_c} a_i b_i(x, y, r)$$

where the magnitude of the coefficients $\alpha_i$ determine to what degree a pattern is present on the substrate.

When measurements are taken at many sites across the substrate (such as n>30), the coefficients $\alpha_i$ of the regression model can be estimated with least squares linear regression. When there are fewer measurements than the number of coefficients (n<nc), the problem is said to be over-determined because many solutions can exactly explain the data.

To circumvent this problem, the set of basis functions is preferably orthogonalized across the entire substrate. Specifically, let the matrix B represent the set of all basis functions $b_i(x,y,r)$ evaluated at each of the possible measurement sites across the substrate. Thus B contains $n_c$ columns (one for each basis function) and n rows (one for each possible measurement site). A QR decomposition is used:

B=QR where Q is an $n \times n_c$ orthonormal matrix with the same column space as B, and R is an $n_c \times n_c$ upper triangular matrix. The columns of Q represent a new set of basis functions that are orthogonal to one another. Thus, an equivalent regression model for the spatial variation can be expressed as:

$$\hat{z} = \sum_{i=1}^{n_c} a_i q_i(x, y, r)$$

where the orthogonalized basis functions can be expressed in terms of the original basis functions by the linear transformation:

$$q = bR^{-1}$$

where q is a vector of the basis functions evaluated at a specific site, b is a vector of the original basis functions evaluated at the same site, and R is the upper triangular matrix.

One key advantage of the equivalent regression model is that the model coefficients $a_i$ can be solved for independently of one another. Specifically, if measurements were acquired at all possible sites, the least squares solution for the model coefficients is given by:

$$\alpha = (Q^T Q)^{-1} Q^T z = Q^T z$$

where a is a vector containing the $n_c$ coefficients of the orthogonal basis functions. Thus, each coefficient is preferably solved by taking a linear transformation of the data. If only sparse samples are available, the coefficients can still be estimated with the same linear transformation on the available data. Thus, it is not necessary to solve for all of the model coefficients simultaneously.

Hypothesis Test for Pattern Existence

A determination of whether a pattern exists on a substrate is preferably made by applying a traditional hypothesis test to determine whether the coefficients of that pattern's orthogonalized basis functions are zero. The null and alternative hypotheses for pattern existence are:

$H_o: a_1 = a_2 = \cdots = a_k = 0$ $H_a: a_k = 0$ for some k $a_1 \ldots a_k$ are the coefficients of the components of interest. The conventional F test is used to see whether there exists a regression relation between the response variable (dice measurements) and the set of predictor variables (the basis functions). One of the advantages of framing this problem as a traditional hypothesis test is that the test includes a user-specified parameter that enables the user to control the tradeoff between the test sensitivity, defined as the probability of detecting the pattern when it actually exists, and the test's false positive rate (type I errors), defined as the probability of detecting a pattern when it does not exist. It is expected that in practice this parameter, called the test's level of significance, would be set at a typical value between about one percent and about five percent.

Hypothesis Test for Pattern Changes

As described above, it is useful in some applications to know if a pattern has changed from what it used to be, rather than if the pattern exists or not. In this case, the pattern is preferably estimated by performing a linear regression to multiple substrates in which the pattern is known to exist, or by performing a linear regression on a single substrate with many measurements. Once the coefficients representing the pattern of interest are estimated, a hypothesis test is prefer-ably applied to subsequent substrates to determine if the pattern is the same. In this case, the hypotheses are described as follows:

$H_o: a_i = \hat{a}_i$ for all i of the component $H_a: a_i = \hat{a}_i$ for some i of the component Where $a_i$ represents the expected pattern and $\hat{a}_i$ is the estimated coefficient from the substrate under consideration. As with the other hypothesis test, the user can control the trade off between the sensitivity of the test and the rate of false positives.

Sampling Optimization to Increase Sensitivity

In many cases, there are many possible sites at which measurements can be taken, but due to the cost of each measurement, only a small number of measurements are actually taken. The final component of the preferred embodiment according to the present invention is an algorithm that selects a user-specified number of sites so as to increase, and preferably maximize, the sensitivity of the hypothesis test for detecting whether a pattern exists.

The algorithm contains two elements. First, the trace of the estimated variance-covariance matrix of the model coefficients ($a_i$) is used as a metric of the test's sensitivity. This is a relatively important element because the sensitivity of the test tends to depend on the distribution of the measurements, which is typically never known in practice. Monte Carlo simulations can be used to estimate the sensitivity, but these estimates are biased and difficult to use for parameter optimization because they are stochastic. The motivation for using the trace of the estimated variance-covariance matrix is that this represents that sum of the estimated variances of each of the model coefficients. The rationale is that reducing the variability of the estimated model coefficients enables a more accurate estimate of these coefficients, and thereby increases the power of the hypothesis test described earlier. The computation required to calculate this metric is negligible.

The second relatively important element is the use of the cyclic coordinate method, which is a nonlinear optimization algorithm. This method is applied in one embodiment as follows. Randomly pick a set of sample sites across the substrate from all possible sample sites. With all of the sites fixed except for one, exhaustively search all of the possible sample sites for the one that at least increases and most preferably maximizes the test's sensitivity, as estimated by the trace of the variance-covariance matrix. Once a new site has been selected, apply the same exhaustive search to each of the set of sample sites. This process is repeated until the algorithm is no longer able to move a single sample site that would improve the test's estimated sensitivity. This algorithm can also be stated in terms of the following steps:

1. Determine which components will be tested for (which coefficients).
2. Specify the possible sampling sites.
3. Randomly select a set of n sites.
4. Select an element i of the set to optimize.
5. Of all the possible sample sites on the substrate, select the one that maximizes the variance-covariance matrix.
6. Repeat steps 4 and 5 for all n sites in the set.
7. If any of the sites changed, repeat steps 4-6.

This use of the cyclic coordinate method is a bit unconventional. Typically this algorithm is applied to optimize a multivariate function of continuous parameters with a line search algorithm that does not guarantee a global optimum will be found. In this case, the optimization at each step is an exhaustive search over all possible measurement sites, which is a discrete set. Thus, the optimization is done on a set, rather than on a range of continuous values and the optimization at each step is an exhaustive search, rather than a local search.

EXAMPLE

FIG. 1 depicts the sensitivities of the sampling algorithm of the present invention (upper line) and another sampling plan (lower line), each consisting of from five to twenty-three points. In this example, the test was applied to determine whether a first-order radial component existed or not. The sensitivity was estimated with synthetic substrates in which the radial component was known to be present. The synthetic substrates had 226 dice, twelve systematic components, and random noise. The size of the photo mask was 4×4. The vertical lines in the plot show the ninety percent range of the hypothesis tests over a set of one thousand synthetic substrates. The graph depicts the average sensitivity, which is the fraction of substrates on which the hypothesis test was able to detect that the pattern actually existed. The level of significance for all of these tests was set at two percent.

In this example, and many others that are not specifically described herein, the present method was able to select sample locations that resulted in a much greater sensitivity than the other sampling methods. This demonstrates the possible advantage of using the present algorithm to select sample locations.

The preferred embodiments of the present invention have the following features. QR orthogonalization is preferably used to make the components (or basis functions) distinct and orthogonal. Principle component regression enables an estimate of spatial substrate variation with sparse measurements. A hypothesis test is used in a new application to determine whether specific spatial patterns on a substrate exist. A hypothesis test is used in a new application to determine whether specific spatial patterns on a substrate have changed. The trace of the estimated variance-covariance matrix of model coefficients is used as a measure of the test's statistical sensitivity. A new optimization algorithm is used to select the sites that at least increase and preferably maximize the approximate sensitivity of the test. Finally, a system is included that allows an end user to accommodate multiple patterns and weigh the pros and cons of detecting each pattern.

Figure 2:
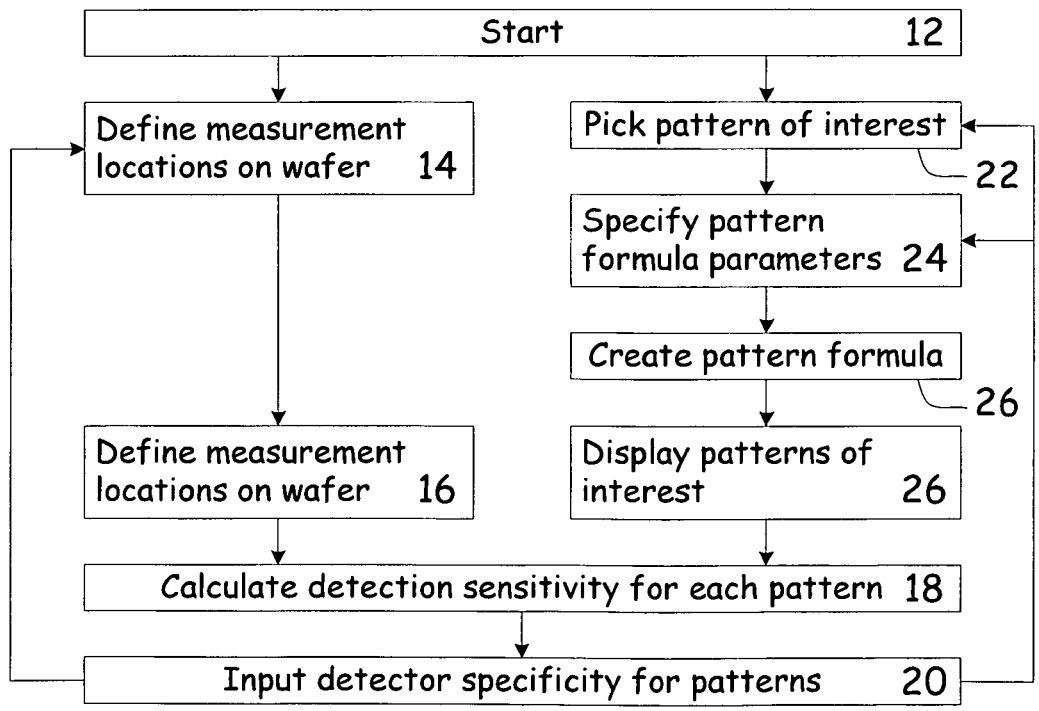
FIG. 2 depicts a flow chart for a preferred method of the present invention.

FIG. 2 depicts a flow chart of a method 10 according to a preferred embodiment of the invention. As depicted, the method 10 starts as in block 12, with two different entry points into parallel processes. In one of the processes, the measurement locations are defined on the substrate, as given in block 14. The measurement locations are displayed as given in block 16. In the second process, patterns of interest are selected, as given in block 22. These patterns of interest are those patterns that are evident on a substrate, such as from a given process, as described above. Pattern formula parameters for the patterns selected in block 22 are specified, as given in block 24, and the pattern formulas are created as given in block 26. The patterns of interest are displayed as given in block 28.

The output from these two parallel process streams is used to calculate a detection sensitivity for each of the selected patterns, as given in block 18, which is preferably the probability that the detector will detect a pattern when the pattern is actually present. The detector specificities for these patterns are input, as given in block 20. The detector specificity is defined as one minus the probability that the detector will detect a pattern when the pattern is not actually present on the substrate. These detector specificities are then fed back to the two parallel process structures to help refine the measurement locations (14), pick patterns of interest (22), and specify the pattern formula parameters (24).

Thus, the present invention provides several advantages over the prior art, including the ability to quantify the effectiveness to measure specific patterns through a goodness of fit or operability indicator. In addition, efficiencies are gained by using the optimization routine, limiting confusion as to the most efficient sampling locations for detecting patterns. The pattern library provides a means to capture and store historical patterns for convenient use with new technologies. The real-time calculation of the strength of the pattern provides another dimension of measurement. Statistical process control trending of this information, such as by monitoring the regression coefficients of interest or p-values from the hypothesis test, provides early warning of emerging characteristic patterns.

The invention was described herein in terms of patterns that are formed across the surface of a substrate, as detected by inline measurements. However, patterns as formed by other substrate characteristics could also be implemented in various embodiments of the invention. For example, locations for electrical test sites would also be of interest. Additionally, this methodology would be useful for detecting special patterns in any medium with limited samples. It is appreciated that the methods of the present invention are applicable to any measurement technique that provides a quantitative value associated with a spatial coordinate on the substrate.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for selecting test site locations on a substrate, the method comprising the steps of:
   a) specify a subset of all test site locations on the substrate,
   b) select a desired number of candidate test site locations from within the subset of test site locations on the substrate,
   c) while selecting one of the candidate test site locations and holding all others of the candidate test site locations as fixed, determine a new location for the selected one of the candidate test site locations, which new location increases a test sensitivity to at least one predetermined pattern, as estimated by a trace of a variance-covariance matrix, and
   d) repeat step c for each candidate test site location in the subset of test site locations to produce a finalized set of candidate test site locations, until a desired end point is attained.

2. The method of claim 1, wherein the desired end point is that the test sensitivity cannot be further increased by selecting a new location within the finalized subset of test site locations on the substrate.

3. The method of claim 1, wherein the desired end point is that all locations within the finalized subset of test site locations on the substrate have been adjusted for a desired number of iterations.

4. The method of claim 1, wherein the desired end point is that the test sensitivity has attained a desired level.

5. The method of claim 1, further comprising the steps of:
sense characteristics of the substrate at the finalized subset of test site locations, and
analyze the sensed characteristics to determine whether the sensed characteristics indicate the predetermined pattern on the substrate.

6. The method of claim 5, wherein the characteristics of the substrate are sensed by one of optical inspection and electrical test of the substrate.

7. The method of claim 5, wherein the characteristics of the substrate are sensed by a measurement system that provides a quantitative value associated with a spatial coordinate on the substrate.

8. The method of claim 1, further comprising the steps of:
sense characteristics of the substrate at the finalized subset of test site locations, and
analyze the sensed characteristics to determine whether the sensed characteristics indicate that the predetermined pattern on the substrate has changed by at least a given amount.

9. The method of claim 8, wherein the characteristics of the substrate are sensed by one of optical inspection and electrical test of the substrate.

10. The method of claim 8, wherein the characteristics of the substrate are sensed by a measurement system that provides a quantitative value associated with a spatial coordinate of the substrate.

11. A method for analyzing a substrate, the method comprising the steps of:
a) specify a subset of all test site locations on the substrate,
b) select a desired number of candidate test site locations from within the subset of test site locations on the substrate,
c) while selecting one of the candidate test site locations and holding all others of the candidate test site locations as fixed, determine a new location for the selected one of the candidate test site locations, which new location increases a test sensitivity to at least one predetermined pattern, as estimated by a trace of a variance-covariance matrix,
d) repeat step c for each candidate test site location in the subset of test site locations to produce a finalized set of candidate test site locations, until a desired end point is attained,
e) sense characteristics of the substrate at the finalized subset of test site locations, and
f) analyze the sensed characteristics to determine whether the sensed characteristics indicate the predetermined pattern on the substrate.

12. The method of claim 11, wherein the desired end point is that the test sensitivity cannot be further increased by selecting a new location within the finalized subset of test site locations on the substrate.

13. The method of claim 11, wherein the desired end point is that all locations within the finalized subset of test site locations on the substrate have been adjusted for a desired number of iterations.

14. The method of claim 11, wherein the desired end point is that the test sensitivity has attained a desired level.

15. The method of claim 11, wherein the characteristics of the substrate are sensed by at least one of optical inspection of the substrate and electrical test of the substrate.

16. A method for analyzing a substrate, the method comprising the steps of:
a) specify a subset of all test site locations on the substrate,
b) select a desired number of candidate test site locations from within the subset of test site locations on the substrate,
c) while selecting one of the candidate test site locations and holding all others of the candidate test site locations as fixed, determine a new location for the selected one of the candidate test site locations, which new location increases a test sensitivity to at least one predetermined pattern, as estimated by a trace of a variance-covariance matrix,
d) repeat step c for each candidate test site location in the subset of test site locations to produce a finalized set of candidate test site locations, until a desired end point is attained,
e) sense characteristics of the substrate at the finalized subset of test site locations, and
f) analyze the sensed characteristics to determine whether the sensed characteristics indicate that the predetermined pattern on the substrate has changed by at least a given amount.

17. The method of claim 16, wherein the desired end point is that the test sensitivity cannot be further increased by selecting a new location within the finalized subset of test site locations on the substrate.

18. The method of claim 16, wherein the desired end point is that all locations within the finalized subset of test site locations on the substrate have been adjusted for a desired number of iterations.

19. The method of claim 16, wherein the desired end point is that the test sensitivity has attained a desired level.

20. The method of claim 16, wherein the characteristics of the substrate are sensed by at least one of optical inspection of the substrate and electrical test of the substrate.

* * * * *